United States Patent
Weiler et al.

(10) Patent No.: US 9,422,471 B2
(45) Date of Patent: Aug. 23, 2016

(54) MN-ACTIVATED HEXAFLUOROSILICATES FOR LED APPLICATIONS

(71) Applicant: KONINKLIJKE PHILIPS N.V., Eindhoven (NL)

(72) Inventors: Volker Weiler, Eindhoven (NL); Wolfgang Schnick, Eindhoven (NL); Peter Josef Schmidt, Eindhoven (NL); Markus Armin Seibald, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/007,982

(22) PCT Filed: Dec. 6, 2012

(86) PCT No.: PCT/IB2012/057032
§ 371 (c)(1),
(2) Date: Sep. 27, 2013

(87) PCT Pub. No.: WO2013/088313
PCT Pub. Date: Jun. 20, 2013

(65) Prior Publication Data
US 2014/0320788 A1 Oct. 30, 2014

Related U.S. Application Data

(60) Provisional application No. 61/576,434, filed on Dec. 16, 2011.

(51) Int. Cl.
*C09K 11/61* (2006.01)
*H01L 33/50* (2010.01)
*G02F 1/1335* (2006.01)

(52) U.S. Cl.
CPC ............ *C09K 11/616* (2013.01); *C09K 11/617* (2013.01); *G02F 1/1336* (2013.01); *H01L 33/502* (2013.01); *H01L 33/504* (2013.01)

(58) Field of Classification Search
CPC ..... H01L 33/502; C09K 11/57; C09K 11/617
See application file for complete search history.

(56) References Cited

U.S. PATENT DOCUMENTS 7,497,973 B2 * 3/2009 Radkov et al. ......... 252/301.4 H
7,847,309 B2 12/2010 Radkov
(Continued)

FOREIGN PATENT DOCUMENTS

CN 101939857 A 1/2011
CN 101719531 A 6/2011
(Continued)

OTHER PUBLICATIONS

Adachi et al, "Direct Synthesis and Properties of K2SiF6Mn4 Phosphor by Wet Chemical Etching . . . " Journal of Applied Physics 104, 023512 (2008).
(Continued)

*Primary Examiner* — Carol M Koslow

(57) ABSTRACT

The invention provides a lighting unit comprising a light source, configured to generate light source light and a luminescent material, configured to convert at least part of the light source light into luminescent material light, wherein the light source comprises a light emitting diode (LED) and wherein the luminescent material comprises a phosphor comprising $M_2AX_6$ doped with tetravalent manganese, wherein M comprises monovalent cations, at least comprising potassium and rubidium, wherein A comprises a tetravalent cation, at least comprising silicon, wherein X comprises a monovalent anion, at least comprising fluorine, and wherein $M_2AX_6$ has the hexagonal phase.

11 Claims, 4 Drawing Sheets

(56) References Cited

U.S. PATENT DOCUMENTS

| 8,057,706 | B1 | | 11/2011 | Setlur | |
|---|---|---|---|---|---|
| 2006/0169998 | A1 | | 8/2006 | Radkov | |
| 2009/0162667 | A1 | * | 6/2009 | Radkov | 428/426 |
| 2010/0091215 | A1 | | 4/2010 | Fukunaga | |
| 2010/0142189 | A1 | | 6/2010 | Hong | |

FOREIGN PATENT DOCUMENTS

| GB | 1360690 | * | 7/1974 |
|---|---|---|---|
| WO | 2004036962 | A1 | 4/2004 |
| WO | 2011073951 | A2 | 6/2011 |

OTHER PUBLICATIONS

First Office Action issued May 13, 2015 from Chinese Application No. 201280016489.0.

First Office Action issued Jan. 14, 2016 from Chinese Application No. 201280016489.0. 0.

EPO as ISA, International Search Report mailed Mar. 13, 3013 from International Application No. PCT/IB2012/057032 filed Jun. 12, 2012.

* cited by examiner

MN-ACTIVATED HEXAFLUOROSILICATES FOR LED APPLICATIONS

CROSS-REFERENCE TO PRIOR APPLICATIONS

This application is the U.S. National Phase application under 35 U.S.C. §371 of International Application No. PCT/IB2012/057032, filed on Dec. 6, 2012, which claims the benefit of U.S. Provisional Application No. 61/576434 filed on Dec. 16, 2011. These applications are hereby incorporated by reference herein.

FIELD OF THE INVENTION

The invention relates to a manganese doped alkaline hexafluorosilicate phosphor, a lighting unit comprising such phosphor and a method for the preparation of such phosphor

BACKGROUND OF THE INVENTION

Red luminescent materials for LED (light emitting device) applications are known in the art. The international patent application WO/2004/036962, for instance, describes a light emitting device comprising a light emitting structure capable of emitting primary light of a wavelength less than 480 nm and a luminescent screen comprising a phosphor of general formula $(Sr_{1-a-b}Ca_bBa_cMg_dZn_e)Si_xN_yO_z:Eu_a$, wherein $0.002 \le a \le 0.2$, $0.0 \le b \le 0.25$, $0.0 \le c \le 0.25$, $0.0 \le d \le 0.25$, $0.0 \le e \le 0.25$, $1.5 \le x \le 2.5$, $1.5 \le y \le 2.5$ and $1.5 < z < 2.5$. Further, WO/2004/030109 describes an UV-blue excitable green luminescent material consisting of a Eu-doped oxynitride host lattice with general composition $MSi_2O_2N_2$, wherein M is at least one of an alkaline earth metal chosen from the group Ca, Sr, Ba.

SUMMARY OF THE INVENTION

Current phosphor converted (pc) LED solutions suffer either from lacking intensity in the red spectral region, which forbids the manufacture of warm white devices (CCT<5000K) and limits color rendition properties or they have to use phosphors which have a substantial portion of the emitted energy at wavelengths >650 nm and hamper the luminous efficiency (lm/W) of such devices due to the limited eye sensitivity in the deep red spectral region. The latter phosphors are usually band emitting materials based on activation by Eu(II) (i.e. divalent europium). With this activator, spectral bandwidth expressed as the full width half maximum (FWHM) of the emission spectrum is intrinsically limited to about 50 nm at the needed emission wavelengths (peak maximum >600 nm). Thus for pcLEDs luminescent materials with narrow band or line emission in the red spectral region are very desirable as they will offer increased spectral efficiency for illumination purposes. In displays such materials with saturated red color points lead to a wider color gamut if used e.g. in LEDs for LCD backlights.

The mentioned limitations of Eu(II)-doped materials can in principle be overcome with line emitting activators like Eu(III) or Mn(IV) (i.e. tetravalent manganese). While the first can only be excited with UV light excluding the use in pcLEDs with blue emitting dies, Mn(IV) phosphors with absorption in the blue spectral region are known for a long time. These include oxides like titanates or spinels (e.g. $Ca_2TiO_4$:Mn, $CaAl_{12}O_{19}$:Mn), oxo-fluorides like magnesium fluorogermanate ($Mg_{28}Ge_{7.55}O_{32}F_{15.04}$:Mn) and fluorides like hexafluorosilicates (e.g. $K_2SiF_6$:Mn). Oxygen ligands are quite covalent leading to emissions in the deep red (>650 nm), whereas the fluorides show attractive spectral properties. However, the luminous efficacy is below 200 lm/W which results in a limited color gamut when used in LEDs for LCD backlights. Alternatives for such materials are therefore sought after.

Hence, it is an aspect of the invention to provide an alternative red luminescent material, which preferably further at least partly obviate one or more of above-described drawbacks, which preferably absorbs well in the blue and/or UV, especially in the blue, and/or which efficiently converts the absorbed light into red light, and/or which preferably does not substantially absorb at wavelength longer than blue light (such as in the green and/or yellow). It is further an aspect to provide an alternative lighting unit, configured to use such alternative red luminescent material.

In a first aspect, the invention provides a lighting unit comprising a light source, configured to generate light source light and a luminescent material, configured to convert at least part of the light source light into luminescent material light, wherein the light source especially comprises a light emitting diode (LED) and wherein the luminescent material comprises a phosphor comprising $M_2AX_6$ doped with tetravalent manganese ($Mn^{4+}$ or Mn(IV)), wherein M comprises monovalent cations, at least comprising potassium and rubidium, wherein A comprises a tetravalent cation, at least comprising silicon, wherein X comprises a monovalent anion, at least comprising fluorine, and wherein $M_2AX_6$ has the hexagonal phase.

In a second aspect, the invention also provides such phosphor per se, i.e. a phosphor comprising $M_2AX_6$ doped with tetravalent manganese, wherein M comprises monovalent cations, at least comprising potassium and rubidium, wherein A comprises a tetravalent cation, at least comprising silicon, wherein X comprises a monovalent anion, at least comprising fluorine, and wherein $M_2AX_6$ has the hexagonal phase. Such phosphor belongs to the class of (alkaline) hexafluorosilicate phosphors. The phrase "wherein M comprises monovalent cations at least comprising potassium and rubidium" indicates for instance that of all M cations in a mole $M_2AX_6$, a fraction comprises $K^+$ and a fraction comprises $Rb^+$, and an optionally remaining fraction comprises one or more other monovalent cations (see also below).

Herein, $M_2AX_6$ doped with tetravalent manganese, having the hexagonal phase, may further also shortly be indicated as "phosphor", i.e. the phrase "phosphor comprising $M_2AX_6$ doped with tetravalent manganese" may in an embodiment also be read as $M_2AX_6$ doped with tetravalent manganese phosphor, or (tetravalent) Mn-doped $M_2AX_6$ phosphor, or shortly "phosphor".

The invented luminescent compound or phosphor KRbSiF$_6$:Mn (and analogues compounds, such as wherein one or more of the host lattice cations or anions are partly replaced with other cations or anions) has a significant higher luminous efficacy (>200 lm/W) and an additional emission peak which make this compound distinguishable from hexafluorosilicates like Mn-doped $K_2SiF_6$. The phosphor $KRbSiF_6$:Mn, for instance, emits a spectrum of a couple of narrow lines centered at ca. 630 nm, it has a strong and broad absorption band in the 455 nm region. It is therefore well suited for the fabrication of pcLEDs with high spectral efficiencies and color rendition. This can be applied in lighting units for general lighting but also for backlighting. The term ":Mn" or ":$Mn^{4+}$", indicates that part of the tetravalent A ions is replaced by the tetravelent Mn.

The term "tetravalent manganese" refers to $Mn^{4+}$. This is a well-known luminescent ion. In the formula as indicated above, part of the tetravalent cation A (such as Si) is being replaced by manganese. Hence, $M_2AX_6$ doped with tetravalent manganese may also be indicated as $M_2A_{1-m}Mn_mX_6$. The mole percentage of manganese, i.e. the percentage it replaces the tetravalent cation A will in general be in the range of 0.1-15%, especially 1-12%, i.e. m is in the range of 0.001-0.15, especially in the range of 0.01-0.12.

A comprises a tetravalent cation, and at least comprises silicon. A may optionally further comprise one or more of titanium (Ti), germanium (Ge), stannum (Sn) and zinc (Zn). Preferably, at least 80%, even more preferably at least 90%, such as at least 95% of A consists of silicon. Hence, in a specific embodiment, $M_2AX_6$ may also be described as $M_2Si_{1-m-t-g-s-zr}Mn_mTi_tGe_gSn_sZr_{zs}X_6$, wherein m is as indicated above, and wherein t,g,s,zr are each individually preferably in the range of 0-0.2, especially 0-0.1, even more especially 0-0.05, wherein t+g+s+zr is smaller than 1, especially equal to or smaller than 0.2, preferably in the range of 0-0.2, especially 0-0.1, even more especially 0-0.05, and wherein A is especially Si.

As indicated above, M relates to monovalent cations, but at least comprises potassium and rubidium. Other monovalent cations that may further be comprised by M can be selected from the group consisting of lithium (Li), sodium (Na), cesium (Cs) and ammonium ($NH_4^+$). Preferably, at least 80%, even more preferably at least 90%, such as 95% of M consists of potassium and rubidium. The molar ratio between potassium and rubidium is especially in the range of 0.5-2 (i.e. moles K/moles Rb is in the range of 0.5-2), such as 0.8-1.2, especially 0.9-1.1, even more especially 0.95-1.05, and especially 1.0. Hence, in a specific embodiment, $M_2AX_6$ can also be described $(K_{1-r-l-n-c-nh}Rb_rLi_lNa_nCs_c(NH_4)_{nh})_2AX_6$, wherein r is in the range of 0.2-0.8 (and wherein the ratio potassium-rubidium is preferably as indicated before), wherein l,n,c,nh are each individually preferably in the range of 0-0.2, especially 0-0.1, even more especially 0-0.05, and wherein l+n+c+nh is smaller than 1, especially equal to or smaller than 0.2, preferably in the range of 0-0.2, especially 0-0.1, even more especially 0-0.05.

As indicated above, X relates to a monovalent anion, but at least comprises fluorine. Other monovalent anions that may optionally be present may be selected from the group consisting of chlorine (Cl), bromine (Br), and iodine (I). Preferably, at least 80%, even more preferably at least 90%, such as 95% of X consists of fluorine. Hence, in a specific embodiment, $M_2AX_6$ can also be described $M_2A(F_{1-cl-b-i}Cl_{cl}Br_bI_i)_6$, wherein cl,b,i are each individually preferably in the range of 0-0.2, especially 0-0.1, even more especially 0-0.05, and wherein cl+b+i is smaller than 1, especially equal to or smaller than 0.2, preferably in the range of 0-0.2, especially 0-0.1, even more especially 0-0.05.

Hence, $M_2AX_6$ can also be described $(K_{1-r-l-n-c-nh}Rb_rLi_lNa_nCs_c(NH_4)_{nh})_2Si_{1-m-t-g-s-zr}Mn_mTi_tGe_gSn_sZr_{zr}(F_{1-cl-b-i}Cl_{cl}Br_bI_i)_6$, with the values for r,l,n,c,nh,m,t,g,s,zr,cl,b,i as indicated above.

In a preferred embodiment, $M_2AX_6$ comprises $KRbSiF_6$ (i.e. r=0.5 and l,n,c,nh,t,g,s,zr,cl,b,i are 0). As indicated above, part of silicon is replaced by manganese (i.e. the formula may also be described as $KRbSi_{1-m}Mn_mF_6$, with m as indicated above, or as $KRbSiF_6$:Mn). As manganese replaces part of a host lattice ion and has a specific function, it is also indicated as "dopant" or "activator". Hence, the hexafluorosilicate is doped or activated with manganese ($Mn^{4+}$).

In yet a further aspect, the invention provides a method for the preparation of the phosphor as described herein, the method comprises mixing (i) a soluble salt of a monovalent cation, wherein the soluble salt of the monovalent cation at least comprises potassium and rubidium, (ii) a soluble salt of a tetravalent manganese precursor, (iii) a silicon source, in (iv) an aqueous solution of an inorganic acid, preferably at least comprising HF, precipitating the phosphor (as defined), and drying the phosphor thus obtained, wherein a drying or any other optional later heat treatment process of the phosphor is performed at a temperature below 200° C. At higher temperatures, the cubic phase may be formed, which is not desired.

The term "soluble salt of a monovalent cation" refers especially to a (starting material) salt having one or more anions selected from the group consisting of fluoride, chloride, bromide, iodide, nitrate, acetate, chlorate, citrate, cyanide, formate, phosphate, oxalate, sulfate and tartrate, especially monovalent cations salts having monovalent anions, such as KF, KCl, $KNO_3$, RbF, RbCl, $RbNO_3$, etc. Preferably, the solubility of the soluble salt of the monovalent cation is at least 1 gram/l water (at room temperature and 1 bar), especially at least 5 gram/l, even more especially at least 10 gram/l water (at room temperature and 1 bar). Especially fluorides may be applied. The soluble salt of the monovalent cation may be a mix salt, such as $(K_{0.5}Rb_{0.5})F$. The term "soluble salt of the monovalent cation" may also refer to a mixture of salts, such as KF and RbF.

The term "soluble salt of tetravalent manganese precursor" especially refers to a (starting material) salt that may provide tetravalent manganese species, but wherein the (starting material) salt not necessarily already comprises tetravalent manganese, as this may also be formed later. For instance, as educt, $KMnO_4$ can be used. In this case, the manganese is heptavalent (Mn (VII)). During the reaction, Mn(VII) is reduced to Mn(IV). The term "soluble salt of tetravalent manganese precursor" especially relates to a manganese salt having one or more cations selected from the group consisting of lithium, sodium, potassium, rubidium, cesium, and ammonium, especially manganese precursor salts having monovalent cations selected from the group consisting of potassium and ammonium, such as $KMnO_4$ and $NH_4MnO_4$. Especially a permanganate as soluble salt of tetravalent manganese precursor is desired. Preferably, the solubility of the soluble salt of tetravalent manganese precursor is at least 1 gram/l water (at room temperature and 1 bar), especially at least 5 gram/l, even more especially at least 10 gram/l water (at room temperature and 1 bar).

The (starting material) silicon source may be soluble, but especially $SiO_2$ (and/or Si) may be applied.

When part of the cations and/or anions are replaced with other cations and/or anions, as indicated above, the same principles apply.

The aqueous solution is especially a mixture of water and hydrogen fluoride, such as concentrated HF acid (liquid state). Other inorganic acids that may be used alternatively or additionally may be selected from the group consisting of HBr acid and HCl acid (liquid state). For pure fluoride phosphor, preferably only HF as inorganic acid is applied. Hence, the aqueous solution preferably comprises HF and water, such as concentrated HF.

The starting materials (comprising the soluble salt of a monovalent cation, the soluble salt of tetravalent manganese precursor and the silicon source) are mixed/solved in the aqueous solution. Co-precipitation may start. Thereafter, the liquid may be allowed to rest and the co-precipitated product may be separated from the liquid by decantation or centrifugation, or other methods known in the art.

After the (wet) phosphor is obtained, the phosphor will be dried. This may happen at room temperature, or at elevated temperatures, as long as the cubic phase is not formed. Hence, preferably drying or any other optional later heat treatment process of the phosphor is performed at a temperature below 200° C., such as below 110° C. Hence, during production of the lighting unit (see also below) or subsequent application of the phosphor, preferably the phosphor is (also) kept at a temperature below 200° C., especially below 110° C.

In a specific embodiment, the soluble salt of a monovalent cation comprises rubidium fluoride and potassium hydrogen difluoride ($KHF_2$), the soluble salt of tetravalent manganese precursor comprises $KMnO_4$, the aqueous solution of an inorganic acid at least comprising HF comprises an aqueous HF solution, and the silicon source comprises $SiO_2$.

The term light source may in principle relate to any light source known in the art, but may especially refer to a LED-based light source, herein further indicated as LED. The description below will—for the sake of understanding—only addresses LED-based light sources. The light source is configured to provide UV and or blue light. In a preferred embodiment, the light emitting diode is configured to generate LED light with a blue component. In other words, the light source comprises a blue LED.

In yet another embodiment, the light emitting diode is configured to generate LED light with a UV component. In other words, the light source comprises a UV LED. When a UV light source is applied, and blue or white light is desired, as blue component, for instance the well-known material $BaMgAl_{10}O_{17}:Eu^{2+}$ might be applied. However, also other luminescent materials that are able to convert UV light into blue light may alternatively or additionally be applied.

Preferably, the light source is a light source that during operation emits at least light at a wavelength selected from the range of 200-490 nm, especially a light source that during operation emits at least light at wavelength selected from the range of 400-490 nm, even more especially in the range of 440-490 nm. This light may partially be used by the luminescent material(s) (see below). In a specific embodiment, the light source comprises a solid state LED light source (such as a LED or laser diode). The term "light source" may also relate to a plurality of light sources, such as 2-20 (solid state) LED light sources. Hence, the term LED may also refer to a plurality of LEDs. Hence, in a specific embodiment, the light source is configured to generate blue light.

The term white light herein, is known to the person skilled in the art. It especially relates to light having a correlated color temperature (CCT) between about 2000 and 20000 K, especially 2700-20000 K, for general lighting especially in the range of between about 2700 K and 6500 K, and for backlighting purposes especially in the range of between about 7000 K and 20000 K, and especially within about 15 SDCM (standard deviation of color matching) from the BBL (black body locus), especially within about 10 SDCM from the BBL, even more especially within about 5 SDCM from the BBL.

In an embodiment, the light source may also provide light source light having a correlated color temperature (CCT) between about 5000 and 20000 K, e.g. direct phosphor converted LEDs (blue light emitting diode with thin layer of phosphor for e.g. obtaining of 10000 K). Hence, in a specific embodiment the light source is configured to provide light source light with a correlated color temperature in the range of 5000-20000 K, even more especially in the range of 6000-20000 K, such as 8000-20000 K. An advantage of the relative high color temperature may be that there may be a relative high blue component in the light source light.

The terms "violet light" or "violet emission" especially relates to light having a wavelength in the range of about 380-440 nm. The terms "blue light" or "blue emission" especially relate to light having a wavelength in the range of about 440-490 nm (including some violet and cyan hues). The terms "green light" or "green emission" especially relate to light having a wavelength in the range of about 490-560 nm. The terms "yellow light" or "yellow emission" especially relate to light having a wavelength in the range of about 540-570 nm. The terms "orange light" or "orange emission" especially relate to light having a wavelength in the range of about 570-610. The terms "red light" or "red emission" especially relate to light having a wavelength in the range of about 600-750 nm. The term "pink light" or "pink emission" refers to light having a blue and a red component. The terms "visible", "visible light" or "visible emission" refer to light having a wavelength in the range of about 380-750 nm.

The term "luminescent material" may also relate to a plurality of different luminescent materials. The term luminescent material herein especially relates to inorganic luminescent materials. Likewise, this applies to the term "phosphor". These terms are known to the person skilled in the art.

In a further specific embodiment, the luminescent material comprises one or more further phosphors selected from the group consisting of divalent europium containing nitride luminescent material or a divalent europium containing oxynitride luminescent material. The red luminescent material may in an embodiment comprise one or more materials selected from the group consisting of (Ba,Sr,Ca)S:Eu, (Ba,Sr,Ca)AlSiN$_3$:Eu and (Ba,Sr,Ca)$_2$Si$_5$N$_8$:Eu. In these compounds, europium (Eu) is substantially or only divalent, and replaces one or more of the indicated divalent cations. In general, Eu will not be present in amounts larger than 10% of the cation, especially in the range of about 0.5-10%, more especially in the range of about 0.5-5% relative to the cation(s) it replaces. The term ":Eu" or ":Eu$^{2+}$", indicates that part of the metal ions is replaced by Eu (in these examples by Eu$^2$). For instance, assuming 2% Eu in CaAlSiN$_3$:Eu, the correct formula could be (Ca$_{0.98}$Eu$_{0.02}$)AlSiN$_3$. Divalent europium will in general replace divalent cations, such as the above divalent alkaline earth cations, especially Ca, Sr or Ba. The material (Ba,Sr,Ca)S:Eu can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Further, the material (Ba$_5$Sr$_5$Ca)$_2$Si$_5$N$_8$:Eu can also be indicated as M$_2$Si$_5$N$_8$:Eu, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50-100%, especially 50-90% Ba and 50-0%, especially 50-10% Sr, such as Ba$_{1.5}$Sr$_{0.5}$Si$_5$N$_8$:Eu, (i.e. 75% Ba; 25% Sr). Here, Eu is introduced and replaces at least part of M (i.e. one or more of Ba, Sr, and Ca). Likewise, the material (Ba$_5$Sr$_5$Ca)AlSiN$_3$Eu can also be indicated as MAlSiN$_3$Eu$_5$ wherein M is one or more elements selected from the group consisting of barium (Ba) strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Preferably, in an embodiment the first luminescent material comprises (Ca,Sr,Ba)AlSiN$_3$:Eu, preferably CaAlSiN$_3$:Eu. Further, in another embodiment, which may be combined with the former, the first luminescent material comprises (Ca,Sr,Ba)$_2$Si$_5$N$_8$:Eu, preferably (Sr,Ba)$_2$Si$_5$N$_8$:Eu. The terms "(Ca,Sr,Ba)" indicate that the corresponding cation sites may be occupied by calcium, strontium or barium. It also indicates that in such material corresponding cation sites may be occupied with cations selected from the group consisting of calcium, strontium and barium. Thus, the material may for instance comprise calcium and strontium, or only strontium, etc.

Hence, in an embodiment the luminescent material may further comprises $M_2Si_5N_8:Eu^{2+}$, wherein M is selected from the group consisting of Ca, Sr and Ba, even more especially wherein M is selected from the group consisting of Sr and Ba. In yet another embodiment, which may be combined with the former, the luminescent material may further comprise $MAlN_3:Eu^2$, wherein M is selected from the group consisting of Ca, Sr and Ba, even more especially wherein M is selected from the group consisting of Sr and Ba.

The luminescent material may also comprise one or more phosphors selected from the group consisting of a trivalent cerium containing garnet and a trivalent cerium containing oxynitride.

Especially, the luminescent material may further comprise a $M_3A_5O_{12}:Ce^{3+}$ luminescent material, wherein M is selected from the group consisting of Sc, Y, Tb, Gd, and Lu, wherein A is selected from the group consisting of Al and Ga. Preferably, M at least comprises one or more of Y and Lu, and wherein A at least comprises Al. These types of materials may give highest efficiencies. In a specific embodiment, the second luminescent material comprises at least two luminescent materials of the type of $M_3A_5O_{12}:Ce^{3+}$, wherein M is selected from the group consisting of Y and Lu, wherein A is selected from the group consisting of Al, and wherein the ratio Y:Lu differ for the at least two luminescent materials. For instance, one of them may be purely based on Y, such as $Y_3Al_5O_{12}:Ce^{3+}$, and one of them may be a Y,Lu based system, such as $(Y_{0.5}Lu_{0.5})_3Al_5O_{12}:Ce^{3+}$. Embodiments of garnets especially include $M_3A_5O_{12}$ garnets, wherein M comprises at least yttrium or lutetium and wherein A comprises at least aluminium. Such garnet may be doped with cerium (Ce), with praseodymium (Pr) or a combination of cerium and praseodymium; especially however with Ce. Especially, A comprises aluminium (Al), however, A may also partly comprise gallium (Ga) and/or scandium (Sc) and/or indium (In), especially up to about 20% of Al, more especially up to about 10% of Al (i.e. the A ions essentially consist of 90 or more mole % of Al and 10 or less mole % of one or more of Ga, Sc and In); A may especially comprise up to about 10% gallium. In another variant, A and O may at least partly be replaced by Si and N. The element M may especially be selected from the group consisting of yttrium (Y), gadolinium (Gd), terbium (Tb) and lutetium (Lu). Further, Gd and/or Tb are especially only present up to an amount of about 20% of M. In a specific embodiment, the garnet luminescent material comprises $(Y_{1-x}Lu_x)_3B_5O_{12}:Ce$, wherein x is equal to or larger than 0 and equal to or smaller than 1. The term ":Ce" or ":Ce$^{3+}$", indicates that part of the metal ions (i.e. in the garnets: part of the "M" ions) in the luminescent material is replaced by Ce. For instance, assuming $(Y_{1-x}Lu_x)_3Al_5O_{12}:Ce$, part of Y and/or Lu is replaced by Ce. This notation is known to the person skilled in the art. Ce will replace M in general for not more than 10%; in general, the Ce concentration will be in the range of 0.1-4%, especially 0.1-2% (relative to M). Assuming 1% Ce and 10% Y, the full correct formula could be $(Y_{0.1}Lu_{0.89}Ce_{0.01})_3Al_5O_{12}$. Ce in garnets is substantially or only in the trivalent state, as known to the person skilled in the art.

Therefore, the luminescent material may in an embodiment further comprise one or more other phosphors selected from the group consisting of a divalent europium containing nitride luminescent material, a divalent europium containing oxynitride luminescent material, a trivalent cerium containing garnet and a trivalent cerium containing oxynitride.

As will be clear to the person skilled in the art, also combinations of phosphors may be applied. Further, as will be clear to the person skilled in the art, optimization of the luminescent material(s) (or phosphors) with respect to one or more of constituting elements, activator concentration, particle size, etc. or optimization with respect to luminescent material combination(s), may be applied to optimize the illumination device.

The light source may be configured in a chamber, with reflective wall(s) (such as coated with a reflective material like $TiO_2$), and a transparent window. In an embodiment, the window is the light conversion layer. In yet a further embodiment, the window comprises the light conversion layer. This layer may be arranged upstream of the window or downstream of the window. In yet a further embodiment, light conversion layers are applied at both sides of the window.

The terms "upstream" and "downstream" relate to an arrangement of items or features relative to the propagation of the light from a light generating means (here the light source), wherein relative to a first position within a beam of light from the light generating means, a second position in the beam of light closer to the light generating means is "upstream", and a third position within the beam of light further away from the light generating means is "downstream".

The luminescent material is configured to convert at least part of the light source light. In order words, one may say that the light source is radiationally coupled to the luminescent material. When the light source comprises a substantially UV light emitting light source, the luminescent material may be configured to convert substantially all light source light that impinges on the luminescent material. In case the light source is configured to generate blue light, the luminescent material may partly convert the light source light. Dependent upon the configuration, a part of the remaining light source light may be transmitted through a layer comprising the luminescent material.

Below, a number of applications of the invention are indicated:
  office lighting systems
  household application systems
  shop lighting systems,
  home lighting systems,
  accent lighting systems,
  spot lighting systems,
  theater lighting systems,
  fiber-optics application systems,
  projection systems,
  self-lit display systems,
  pixelated display systems,
  segmented display systems,
  warning sign systems,
  medical lighting application systems,
  indicator sign systems, and
  decorative lighting systems
  portable systems
  automotive applications
  green house lighting systems As indicated above, the lighting unit may be used as backlighting unit in an LCD display device. Hence, in a further aspect, the invention provides also a LCD display device comprising the lighting unit as defined herein, configured as backlighting unit.

The term "substantially" herein, such as in "substantially all emission" or in "substantially consists", will be understood by the person skilled in the art. The term "substantially"

may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterising features described in the description and/or shown in the attached drawings.

The various aspects discussed in this patent can be combined in order to provide additional advantages. Furthermore, some of the features can form the basis for one or more divisional applications.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE EMBODIMENTS

The novel mixed alkali metal hexafluorosilicate phosphors disclosed herein are obtained as co-precipitates at room temperature from aqueous HF solution containing the Mn-dopant. For the preparation of $Mn^{4+}$-doped $KRbSiF_6$ stoichiometric amounts of the starting materials RbF, $KHF_2$, and $KMnO_4$ are dissolved in aqueous HF. Subsequently, a stoichiometric amount of $SiO_2$ is added to the aqueous HF solution. The concentration of $Mn^{7+}$ in the aqueous HF solution was 8 mole %. The precipitates were filtered, washed repeatedly with 2-propanole, and then dried at r.t. in vacuum.

Additionally, it is possible that a variety of other starting materials may be used to produce the inventive hexafluorosilicate phosphor via co-precipitation from aqueous solution (e.g. rubidium/potassium nitrate, rubidium/potassium chloride).

Figure 1A:
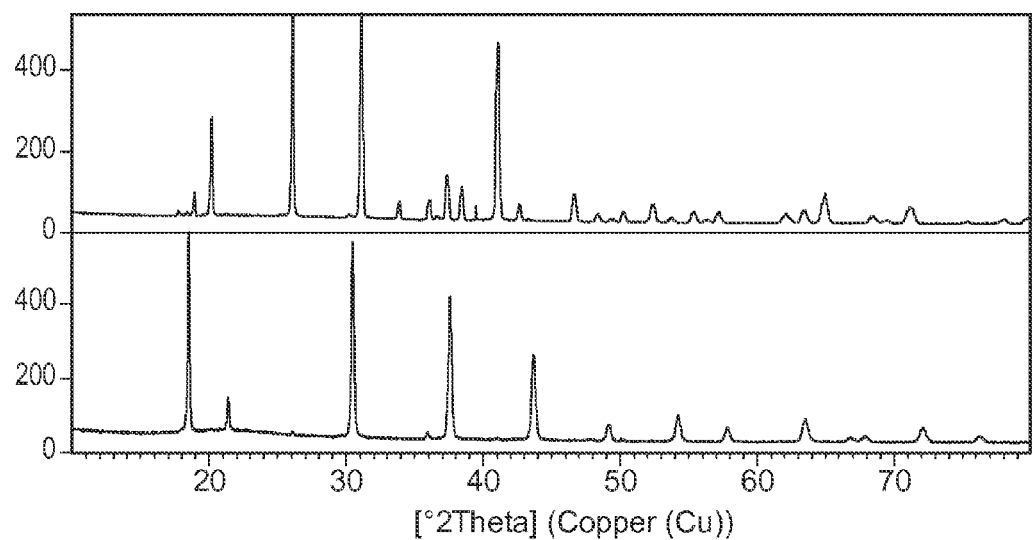
FIG. 1: (A) XRD pattern of precipitated sample as precipitated (upper)(see also Experimental for sample preparation) and after 300° C. (lower). (B) peak list of indexed XRD pattern (upper) and cubic $KRbSiF_6$ from data base (lower). The 1B upper part is thus the peak list of $KRbSiF_6$ as synthesized (XRD measured at room temperature (RT). It does not match with the cubic phase, of which the XRD pattern is displayed in the lower 1B part: the lower part is the reference pattern of the cubic phase of $KRbSiF_6$ from the crystallographic database ICDD (ICDD=international centre for diffraction data). The reference code for the cubic KRbSiF6 is 00-048-0725)
Figure 1B:
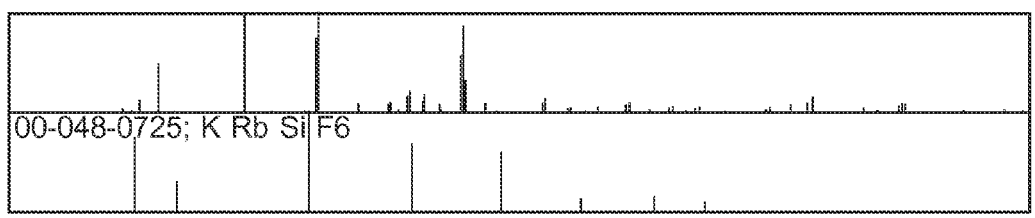

The precipitated sample was indexed as hexagonal lattice from their X-ray powder pattern (using Cu—Kα radiation). After heating at 300° C., the sample transforms to a cubic lattice as found in the XRD data base, see FIG. 1.

Figure 2:
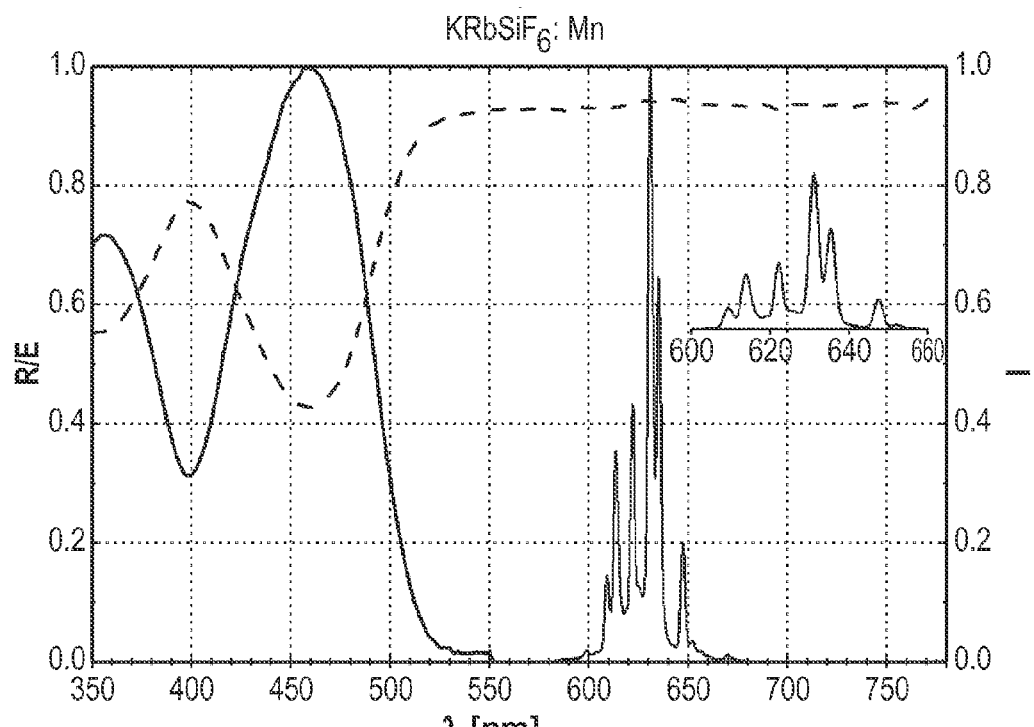
FIG. 2: Reflection (dashed line), excitation (left curve) and photoluminescence spectra (sharp lines at about 625 nm) (excited at 450 nm) of $KRbSiF_6$:Mn at RT; Intensity on the left Y scale relates to reflection (R) and excitation (E)

The photoluminescence spectra (emission spectra) of such Mn-doped alkali hexafluorosilicates reveal an emission in the red region from about 600 to 660 nm. The main emission peak is located at approx. 631 nm. The lumen equivalent of the shown spectrum is at least 200 lm/W. The excitation peak is at about 460 nm (FIG. 2). The reflection in the green and yellow spectral range is at least R>0.92 which results in a very low absorption of green- and yellow-emitted phosphors used for warm white applications. Moreover, the self-absorption of the invented phosphor is advantageously low due to a surprisingly high reflection of at least 0.93 and higher in the spectral range from 600-660 nm.

Due to its specific photo luminescence spectra, the invented material can be very well detected by a using a simple handy spectrometer. The excitation can be performed with a commercially available blue light source (especially in the range at about 450 nm).The emission spectrum consists of a set of specific lines between 600 and 660 nm. Compared to already patented hexafluorosilicates like Mn-doped $K_2SiF_6$, the invented phosphor show a distinguishable narrow emission lines at about 622 nm. Moreover, after heating at 300° C., the specific emission line at 622 nm drops which is also a characteristic feature of the invented materials (FIG. 2A). The drop can be attributed to a phase transition from a hexagonal to a cubic lattice which can be also visualized by crystallographic techniques like X-ray diffractometry. R/E refers to reflectance or excitation signal, normalized to 1.

Figure 3:
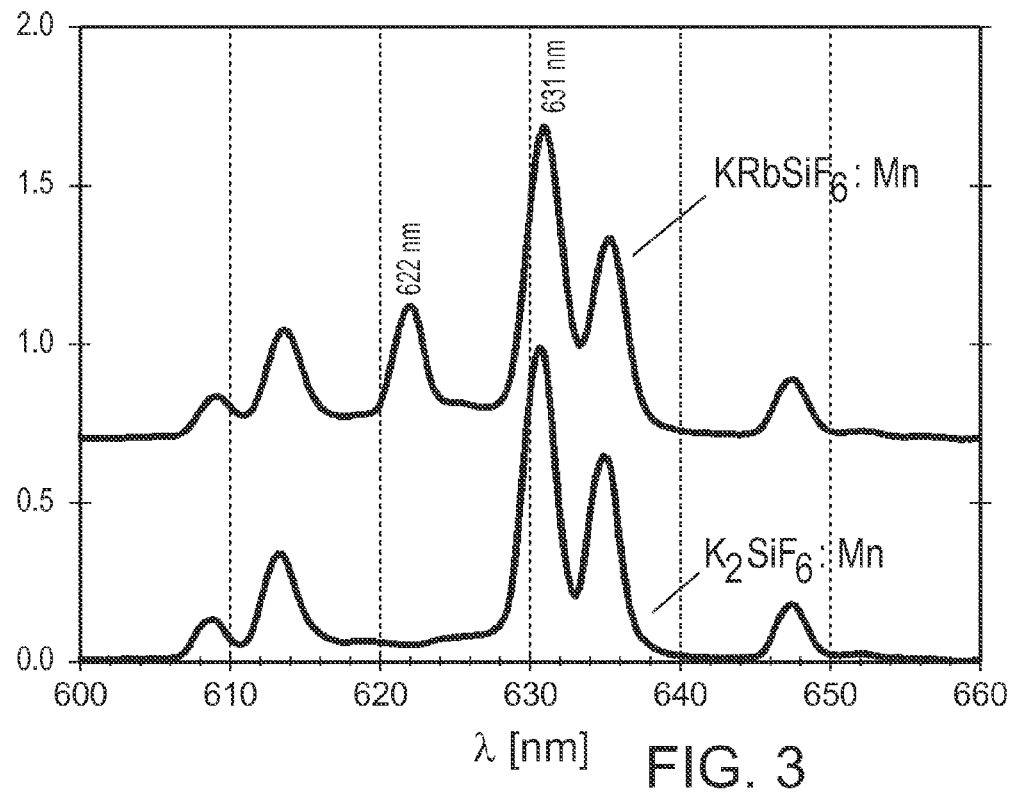
FIG. 3: Emission spectra of Mn-doped $KRbSiF_6$ (upper) and Mn-doped $K_2SiF_6$ (lower) (measured at RT)

FIG. 3 shows emission spectra of Mn-doped $KRbSiF_6$ (upper) and Mn-doped $K_2SiF_6$ (lower). I refers to the photoluminescence intensity, also normalized to 1.

Figure 4:
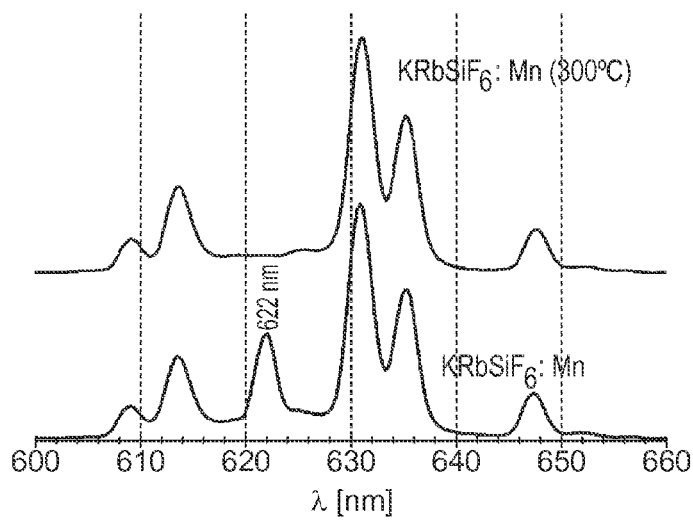
FIG. 4: Emission spectra of Mn-doped $KRbSiF_6$ before (lower) and after heated at 300° C. (upper) (measured at RT)

FIG. 4 shows the emission spectra of Mn-doped $KRbSiF_6$ before (lower) and after heated at 300° C. (upper). It appears that the 622 nm line disappears.

Hence, a relative sharp emissing in the wavelength range of 616-626 nm, especially 620-624 nm may be a distinguishing feature of the claimed hexagonal alkaline hexafluorosilicates.

Figure 5A:
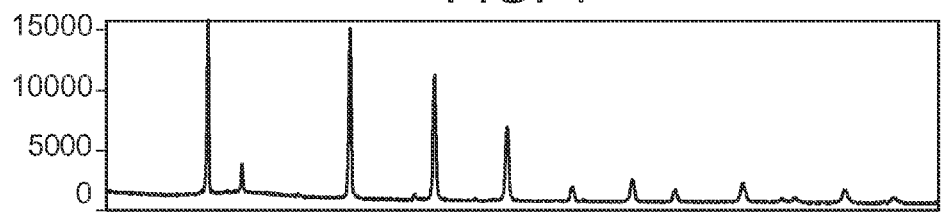
FIG. 5: (A) XRD diagram of Mn-doped $KRbSiF_6$ heated at 300° C. and (B) non-heated, and (C) XRD pattern from XRD data base (00-048-0725) of cubic $KRbSiF_6$; (measured at RT)
Figure 5B:
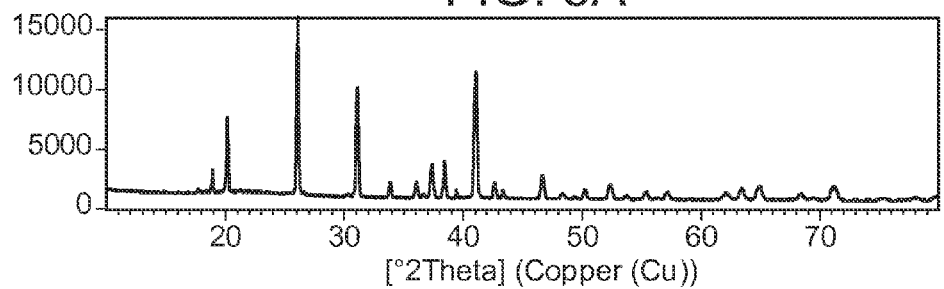
Figure 5C:
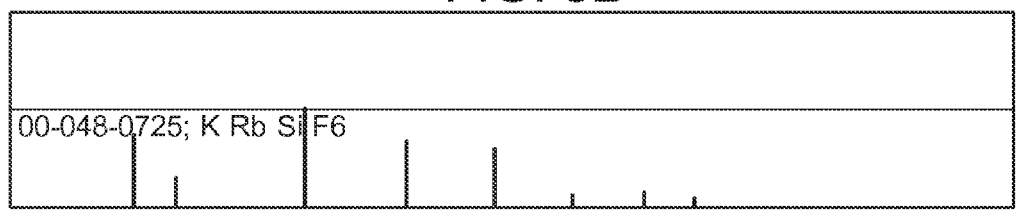

FIG. 5 shows in (A) an XRD diagram of Mn-doped $KRbSiF_6$ heated at 300° C. and (B) non-heated (see also FIG. 4 for the emission spectra), and (C) XRD pattern from XRD data base (00-048-0725) of cubic $KRbSiF_6$; (measured at RT).

Figure 6A:
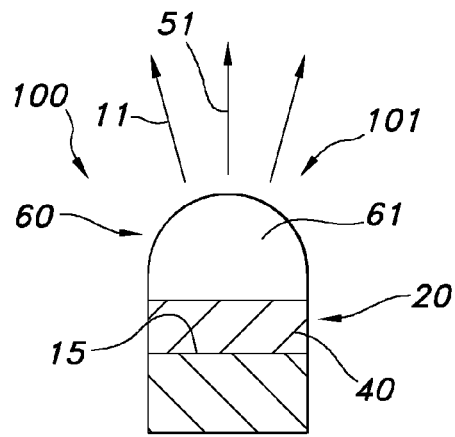
FIGS. 6a-6c schematically depict some embodiments of the lighting unit; the drawings are not necessarily on scale.

FIG. 6a schematically depicts an embodiment of the lighting unit, indicated with reference 100, of the invention. The lighting unit comprises a light source 10, which is in this schematic drawing a LED (light emitting diode). In this embodiment, on top of the light source 10, here on the (light exit) surface 15, thus downstream of the light source 10, a luminescent material 20 is provided. This luminescent material 20 comprises phosphor as described herein, indicated with reference 40. By way of example, the lighting unit 100 further comprises, for instance for light extraction properties, a (transmissive) dome 61. This is an embodiment of a transmissive optical element 60, which is in this embodiment arranged downstream of the light source 10 and also downstream of the light conversion layer 20. The light source 10 provides light source light 11 (not indicated in the drawing), which is at least partly converted by the light conversion layer 20 into luminescent material light 51. The light emanating from the lighting unit is indicated with reference 101, and contains at least this luminescent material light 51, but optionally, dependent upon the absorption of luminescent material 20 also light source light 11.

Figure 6B:
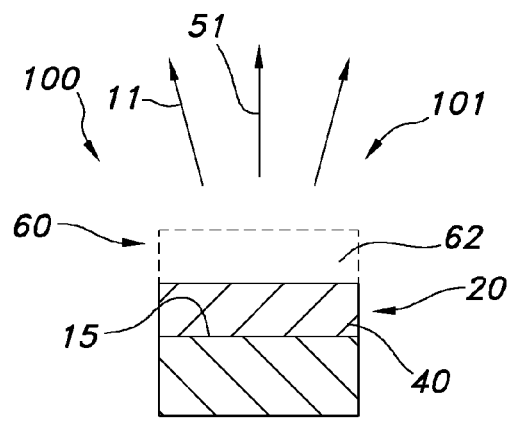

FIG. 6b schematically depicts another embodiment, without dome, but with an optional coating 62. This coating 62 is a further example of a transmissive optical element 60. Note that the coating 62 may in an embodiment be one or more of a polymeric layer, a silicone layer, or an epoxy layer. Alternatively or additionally a coating of silicon dioxide and/or silicon nitride may be applied.

Figure 6C:
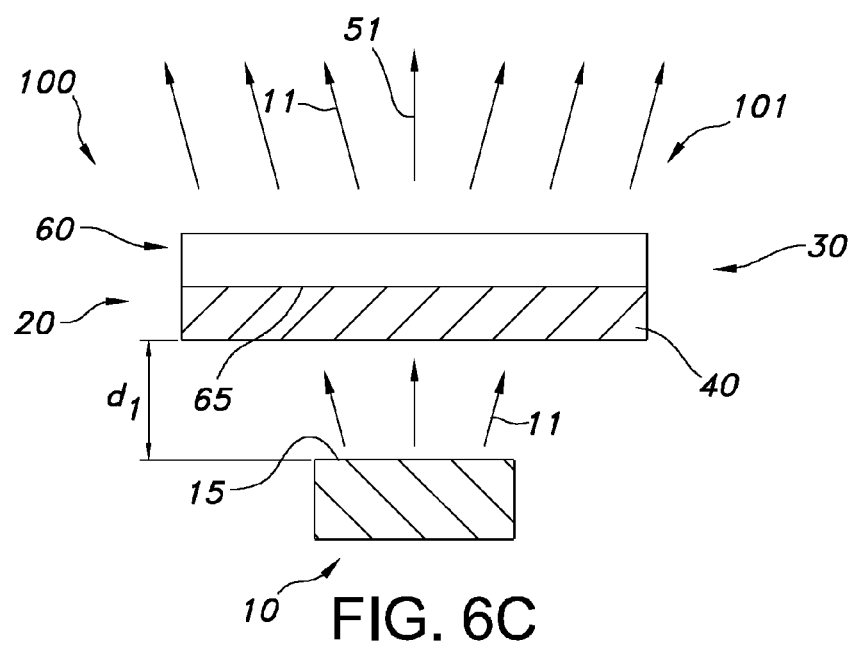

In both schematically depicted embodiment of FIGS. 6a-6b, the luminescent material 20 is in physical contact with the light source 10, or at least its light exit surface (i.e. surface 15), such as the die of a LED. In FIG. 6c, however, the luminescent material 20 is arranged remote from the light source 10. In this embodiment, the luminescent material 20 is configured upstream of a transmissive (i.e. light transmissive) support 30, such as an exit window. The surface of the support 30, to which the light conversion layer 20 is applied, is indicated with reference 65. Note that the luminescent material 20 may also be arranged downstream of the support 30, or at both sides of the support luminescent material 20 may be applied. The distance between the luminescent material 20 and the light source (especially its light exit surface 15) is indicated with reference dl, and may be in the range of 0.1 mm-10 cm. Note that in the configuration of FIG. 6c, in principle also more than one light source 10 may be applied.

EXPERIMENTAL

The novel mixed alkali metal hexafluorosilicate phosphors disclosed herein are obtained as co-precipitates at room temperature from aqueous HF solution containing the Mn-dopant. For the preparation of $Mn^{4+}$-doped $KRbSiF_6$ stoichiometric amounts of the starting materials RbF, $KHF_2$, and $KMnO_4$ are dissolved in aqueous HF. Subsequently, a stoichiometric amount of $SiO_2$ is added to the aqueous HF solution. The concentration of $Mn^{7+}$ in the aqueous HF solution was 8 mole %. The precipitates were filtered, washed repeatedly with 2-propanole, and then dried at RT in vacuum.

Additionally, it is possible that a variety of other starting materials may be used to produce the inventive hexafluorosilicate phosphor via co-precipitation from aqueous solution (e.g. rubidium/potassium nitrate, rubidium/potassium chloride).

The precipitated sample was indexed as hexagonal lattice from their X-ray powder pattern (using Cu—Kα radiation). After heating at 300° C., the sample transforms to a cubic lattice as found in the XRD data base (see also FIGS. 3-5).

What is being claimed is:

1. A lighting unit comprising a light source, for generating light source light and a luminescent material, for converting at least part of the light source light into luminescent material light, wherein the light source comprises a light emitting diode (LED) and wherein the luminescent material comprises a phosphor comprising $(K_{1-r-l-n-c-nh}Rb_rLi_lNa_nCS_c(NH_4)_{nh})_2$ $Si_{1-m-t-g-s-zr}Mn_mTi_tGe_gSn_sZr_{zr}(F_{1-cl-b-i}CL_{cl}Br_bI_i)_6$, wherein m is in the range of 0.001-0.15, wherein t,g,s,zr are each individually in the range of 0-0.2, with t+g+s+zr is greater than 0 and equal to or smaller than 0.2, wherein r is in the range of 0.2-0.8, wherein l,n,c,nh are each individually in the range of 0-0.2, with l+n+c+nh greater than 0 and equal to or smaller than 0.2, wherein cl,b,i are each individually in the range of 0-0.2, with cl+b+i+greater than 0 and equal to or smaller than 0.2, and wherein the phosphor has the hexagonal phase.

2. The lighting unit according to claim 1, wherein the light source is configured to generate blue light.

3. The lighting unit according to claim 1, wherein the luminescent material further comprises one or more other phosphors selected from the group consisting of a divalent europium containing nitride luminescent material, a divalent europium containing oxynitride luminescent material, a trivalent cerium containing garnet and a trivalent cerium containing oxynitride.

4. The lighting, unit according to claim 1 wherein a molar ratio between potassium and rubidium of the phosphor is in the range of 0.5-2.

5. A phosphor comprising $(K_{1-r-1-n-c-nh}Rb_rLi_1Na_nCS_c(NH_4)_{nh})_2Si_{1-m-t-g-s-Zr}Mn_mTi_tGe_gSn_sZr_{zr}(F_{1-c-b-i}Cl_{cl}Br_bI_i)_6$, wherein is in the range of 0.001-0.15, wherein t,g,s,zr are, each individually in the range of 0-0.2, with t+g+s+zr is greater than 0 and equal to or smaller than 0.2, wherein r is in the range of 0.2-0.8, wherein l,n,c,nh are each individually in the range of 0-0.2, with l+n+c+nh greater than 0 and equal to or smaller than 0.2, wherein cl,b,i are each individually in the range of 0-0.2, with cl+b+i greater than 0 and equal to or smaller than 0.2, wherein the phosphor has the hexagonal phase.

6. The phosphor according to claim 5, wherein a molar ratio between potassium and rubidium of the phosphor is in the rancie of 0.5-2.

7. A method for the preparation of the phosphor according to claim 5, the method comprising mixing, a soluble salt of a monovalent cation, wherein the soluble salt of the monovalent cation at least comprises potassium and rubidium, a soluble salt of tetravalent manganese precursor, a silicon source, in an aqueous solution of an inorganic acid at least comprising HF, precipitating the phosphor as defined in any one of claim, and drying the phosphor thus obtained, wherein the drying or any other optional later heat treatment process of the phosphor is performed at a temperature below 200° C.

8. The method according to claim 7, wherein the soluble salt of a monovalent cation is rubidium fluoride (RbF) and potassium hydrogen difluoride ($KIIF_2$), wherein the soluble salt of tetravalent manganese precursor is KMnO$_4$, wherein the aqueous solution of an inorganic acid at least comprising HF comprises an aqueous HF solution, and wherein the silicon source is SiO$_2$.

9. The method according to claim 7, wherein the drying or any other optional later heat treatment process of the phosphor is performed at a temperature below 110° C.

10. The method according to claim 9 wherein a molar ratio between potassium and rubidium of the phosphor is in the range of 0.5-2.

11. An LCD display device comprising a lighting unit comprising
a light source, for generating light source light and
a luminescent material, for converting at least part of the light source light into luminescent material light,
wherein the light, source comprises a light emitting diode (LED),
wherein the luminescent material comprises a phosphor comprising M$_2$AX$_6$ doped with tetravalent manganese, wherein M comprises monovalent cations, at least comprising potassium and rubidium, wherein A comprises a tetravalent cation, at least comprising silicon, wherein X comprises a monovalent anion, at least comprising fluorine, wherein M$_2$AX$_6$ has the hexagonal phase, and wherein M$_2$AX$_6$ has a luminous efficacy greater than 200 lm/W, and wherein the lighting unit is configured as backlighting unit.

* * * * *